(12) United States Patent
Baftiri (10) Patent No.: US 11,570,905 B2
(45) Date of Patent: Jan. 31, 2023

(54) METHOD OF MANUFACTURING COMPONENT CARRIER AND COMPONENT CARRIER

(71) Applicant: AT&S (Chongqing) Company Limited, Chongqing (CN)

(72) Inventor: Artan Baftiri, Chongqing (CN)

(73) Assignee: AT&S(Chongqing) Company Limited, Chongqing (CN)

( * ) Notice: Subject to any disclaimer, the term of this patent is extended or adjusted under 35 U.S.C. 154(b) by 0 days.

(21) Appl. No.: 17/247,077

(22) Filed: Nov. 27, 2020

(65) Prior Publication Data
US 2021/0168944 A1 Jun. 3, 2021

(30) Foreign Application Priority Data
Dec. 2, 2019 (CN) .......................... 201911213381.0

(51) Int. Cl.
*H05K 3/32* (2006.01)
*H05K 1/18* (2006.01)

(52) U.S. Cl.
CPC .............. *H05K 3/32* (2013.01); *H05K 1/185* (2013.01)

(58) Field of Classification Search
CPC .................................. H05K 3/32; H05K 1/185
USPC ........................................................ 174/260
See application file for complete search history.

(56) References Cited

U.S. PATENT DOCUMENTS

| 2012/0032347 A1* | 2/2012 | Chang | H01L 21/561 257/777 |
| 2012/0073747 A1* | 3/2012 | Lee | H05K 1/185 156/293 |
| 2016/0316566 A1 | 10/2016 | Furatani et al. | |
| 2017/0256471 A1* | 9/2017 | Fang | H01L 24/03 |

(Continued)

FOREIGN PATENT DOCUMENTS

| CN | 103228105 A | 7/2013 |
| CN | 207022275 U | 2/2018 |
| CN | 109637981 A | 4/2019 |

(Continued)

OTHER PUBLICATIONS

Silva, J.C.; Extended European Search Report in Application No. 20209858.8; pp. 1-8; Apr. 12, 2021; European Patent Office, 80298, Munich, Germany.

(Continued)

*Primary Examiner* — Andargie M Aychillhum
(74) *Attorney, Agent, or Firm* — Robert A. Blaha (57) ABSTRACT

A method of manufacturing component carriers is disclosed. The method includes providing a stack with at least one electrically conductive layer structure and/or at least one electrically insulating layer structure, forming a first hole in a core of the stack and subsequently embedding a first component in the first hole, thereafter forming a second hole in the same core of the stack and subsequently embedding a second component in the second hole. A component carrier has a stack with at least one electrically conductive layer structure and/or at least one electrically insulating layer structure. A first hole is formed in a core of the stack. A first component is embedded in the first hole. A second hole is formed in the same core of the stack and subsequently a second component is embedded in the second hole.

20 Claims, 2 Drawing Sheets

(56) References Cited

U.S. PATENT DOCUMENTS

2018/0096912 A1* 4/2018 de Sousa ............. H05K 1/0272
2018/0288879 A1* 10/2018 Tuominen ............... H01L 24/20

FOREIGN PATENT DOCUMENTS

EP          3340752 A1    6/2018
WO       2017168323 A1   10/2017

OTHER PUBLICATIONS

First Office Action in Application CN201911213381.0; pp. 1-10; Nov. 19, 2021; China National Intellectual Property Administration; No. 6, Xitucheng Lu, Jimenqiao Haidian District, Beijing City, 1000088, China.
English Translation of cover of First Office Action in Application CN201911213381.0; pp. 1-3; Nov. 19, 2021; China National Intellectual Property Administration; No. 6, Xitucheng Lu, Jimenqiao Haidian District, Beijing City, 1000088, China.

* cited by examiner

METHOD OF MANUFACTURING COMPONENT CARRIER AND COMPONENT CARRIER

CROSS-REFERENCE TO RELATED APPLICATIONS

This application claims the benefit of the filing date of the Chinese Patent Application no. 201911213381.0 filed 2 Dec. 2019, the disclosure of which is hereby incorporated herein by reference.

TECHNICAL FIELD

Embodiments of the invention relate to a method of manufacturing a component carrier and to a component carrier.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. At the same time, component carriers shall be mechanically robust and electrically reliable so as to be operable even under harsh conditions.

In particular, embedding components in a component carrier with rea-sonable manufacturing effort and with a proper electric connection is an issue. In particular, it is challenging to embed components in a component carrier without pronounced warpage.

SUMMARY

There may be a need to embed components in a component carrier in a simple way and with low warpage.

According to an exemplary embodiment of the invention, a method of manufacturing component carriers is provided, wherein the method comprises providing a stack comprising at least one electrically conductive layer structure and/or at least one electrically insulating layer structure, forming a first hole in a core of the stack and subsequently embedding a first component in the first hole, thereafter forming a second hole in the same core of the stack and subsequently embedding a second component in the second hole.

According to another exemplary embodiment of the invention, a component carrier is provided, wherein the component carrier comprises a stack comprising at least one electrically conductive layer structure and/or at least one electrically insulating layer structure, a first component embedded in a first hole of a core of the stack, optionally a first adhesive structure at a bottom of the first component, a second component embedded in a second hole of the same core of the stack, and optionally a second adhesive structure at a bottom of the second component and at a bottom of the first adhesive structure.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "component" may particularly denote any inlay to be integrated in a cavity of a component carrier stack. Said inlay may fulfill an electric function and can be connected to one more electrically conductive layer structures of the stack via its one or more pads.

In the context of the present application, the term "stack" may particularly denote an arrangement of multiple planar layer structures, which are mounted in parallel on top of one another.

In the context of the present application, the term "core" may particularly denote a thick dielectric layer of fully cured material which no longer becomes flowable and cross-links upon temperature increase or exerted mechanical pressure. Such a core may be arranged in a central position of a layer stack. For instance, electrically insulating material of such a core may be a fully cured dielectric material. Such a core may for instance be made of FR4 material. A core may also comprise one or more electrically conductive layer structures, such as patterned copper foils. For example, a thickness of a core may be in a range between 40 µm and 100 µm, or may be even thicker than 100 µm.

In the context of the present application, the term "layer structure" may particularly denote a continuous layer, a patterned layer or a plurality of non-consecutive islands within a common plane.

In the context of the present application, the term "adhesive structure" may particularly denote an adhesive, gluing or sticky material applied to a stack and/or a component during manufacture of a component carrier. For instance, such an adhesive structure may be formed on the basis of a liquid or viscous adhesive which may be dispensed on the stack and/or around at least part of a component and may be cured or solidified thereafter. It is however also possible that the adhesive structure is provided by material of an electrically insulating layer structure which is initially at least partially uncured and is laminated on the stack and/or a component, for instance by the application of heat and/or mechanical pressure. By lamination, uncured resin material of the previously at least partially uncured electrically insulating layer structure may become flowable, may start polymerizing or cross-linking and may then re-solidify. In such an embodiment, the respective adhesive structure is formed by cured material of a previously at least partially uncured electrically insulating layer structure, such as a prepreg sheet. Preferably, the respective adhesive structure (i.e. any of the first to fourth adhesive structures described below) comprises or consists of an electrically insulating material.

According to an exemplary embodiment of the invention, a component carrier is provided which has multiple components embedded within different holes of the same central core of a stack. Conventionally, embedding multiple components side by side in a component carrier causes warpage issues, since multiple simultaneous core cuts may mechanically weaken the core and may thereby promote undesired bending of the stack. In contrast to such conventional approaches, an exemplary embodiment of the invention completes embedding of a first component in a first hole of a stack of a component carrier before starting to form a second hole in the stack and to embed a second component in the second hole. By taking this measure, it can be ensured that the first component is already sufficiently rigidly embedded in the component carrier before a second hole for embedding the second component is formed. As a consequence, it can be prevented that the stack becomes mechanically instable at any time, since an excessive number of simultaneously present holes in the stack is prevented. Consequently, the component carrier according to an exemplary embodiment of the invention is safely protected against warpage already during its manufacture. Said suppression of warpage may be further intensified by embedding multiple components within the same core, since this results in a homogeneous material distribution and a compact design of the component carrier.

Advantageously, it is possible to apply a first adhesive structure below the first component and a second adhesive structure below both the first component and the second component, as bottom side protection structures. Since embedding of the second component is only initiated after completion of the embedding of the first component, the first adhesive structure will not be present beneath the second component. Due to the described manufacturing process, the thickness of adhesive material beneath the two components may be thus different. According to a manufacturing process of an exemplary embodiment, a first component may be embedded in a first hole in the stack. In this context, it is possible to connect the first adhesive structure from below to protect the first component. After this, it is possible to form a further hole and embed the second component in said further hole. No warpage issues occur with said manufacturing architecture, since the second hole is only formed after having glued the first component in place within the first hole. Descriptively speaking, no multiple recessed core occurs during the manufacturing process at any time which enables the core to provide a rigid support during the entire manufacturing process.

In the following, further exemplary embodiments of the method and the component carrier will be explained.

In an embodiment, the method comprises forming first adhesive structure at a bottom of the first component after embedding the first component and before forming the second hole. The first adhesive structure may be formed as a protection structure at the bottom of the first component and preferably also at the bottom of the stack.

In an embodiment, the method comprises forming second adhesive structure at a bottom of the second component and at a bottom of the first adhesive structure after embedding the second component. The second adhesive structure may be formed as a protection structure at the bottom of the second component and may extend preferably also along a bottom of the stack-covering portion of the first adhesive structure.

In an embodiment, each of the first hole and the second hole is a through hole extending through the entire stack. Moreover, the method may then comprise temporarily closing the through holes at a bottom by a temporary carrier before embedding the first component and the second component, respectively. Forming through holes in the stack is simple, for instance by mechanically cutting, etching (for instance by wet etching and/or dry etching) stamping, laser cutting, or any other form of ablation. In order to precisely delimit an accommodation volume of a respective component, it is possible to close the respective through hole from a bottom side by a temporary carrier such as a sticky tape. More specifically, the respective component may be placed on the temporary carrier within the respective through hole.

In an embodiment, the method comprises removing the temporary carrier after having adhered the first component and the second component, respectively, within the stack. Hence, after having glued the respective component in place in the respective through hole by a respective adhesive structure, no mechanical support of the temporary carrier is required any more, since the fully cured adhesive structure in the respective through hole provides sufficient support. For example, the temporary carrier embodied as a sticky tape may simply be peeled off from a lower main surface of the obtained structure.

In an embodiment, the method comprises forming a first electrically conductive contact to contact a bottom of the first component after embedding the second component in the second hole. By forming an electrically conductive contact contacting a bottom of the first component from below allows connecting the embedded first component to an electronic periphery. For instance, one or more recesses may be formed in the material of the first adhesive structure and the second adhesive structure below the first component (for instance by laser drilling) to thereby expose one or more electrically conductive pads of the embedded first component. Said recesses may then be filled with an electrically conductive filling medium such as copper (for instance by electroless deposition, galvanic plating, etc.).

In an embodiment, the method comprises forming a second electrically conductive contact to contact the bottom of the second component after embedding the second component in the second hole. Advantageously, forming the first electrically conductive contact and the second electrically conductive contact may be carried out simultaneously. In a corresponding way as described above for the first electrically conductive contact, it is also possible to connect the embedded second component with an electronic environment from a bottom side.

It should be said that any of the first component and the second component may be placed face up (i.e. with one or more pads on an upper main surface thereof), face down (i.e. with one or more pads at a lower main surface thereof) or with pads at both opposing main surfaces of the component. It is also possible that the first component and/or the second component does not comprise pads.

In an embodiment, the first adhesive structure is a first adhesive layer (in particular having homogeneous thickness), in particular a first adhesive layer having a recess and thus being interrupted in the second hole. Thus, the first adhesive structure may be flat and may form a film on the lower main surface of the first component as well as of the stack. The mentioned recess in the region of the second hole may result from the formation of the second hole as through hole.

In an embodiment, the first adhesive layer also covers a bottom of the core. For instance, material of the first adhesive layer may be applied to an entire lower main surface of the structure obtained after embedding the first component (and optionally after removal of an optional temporary carrier).

In an embodiment, the second adhesive structure is a second adhesive layer (in particular having homogeneous thickness). Thus, also the thickness of the second adhesive layer may be very small so as to contribute to a small vertical height of the component carrier.

In an embodiment, a thickness of the first adhesive layer is in a range between 0.5 µm and 7 µm. Correspondingly, a thickness of the second adhesive layer may be in a range between 0.6 μm and 7 μm. Thus, the component carrier can be manufactured in a vertically compact way. In a corresponding way as the first adhesive layer, also the second adhesive layer may be a flat thin film.

In an embodiment, the component carrier comprises a third adhesive structure encapsulating the first component in the first hole partially or entirely. Correspondingly, the component carrier may comprise a fourth adhesive structure encapsulating the second component in the second hole partially or entirely. In addition to a connection between the components and the stack from a bottom side via the first and second adhesive structures, said third adhesive structure may circumferentially surround the first component to thereby glue it in place within the hole in the stack. As the third adhesive structure circumferentially surrounds the first component, the fourth adhesive structure circumferentially surrounds the second component to glue the latter in place within the second hole.

In an embodiment, the stack comprises only said single core in which the first component and the second component are commonly embedded and in which the first hole and the second hole are formed. A further build-up of the component carrier may then be done on both opposing main surfaces of the core, in particular symmetrically.

In an embodiment, substantially an entire vertical extension of the first component and of the second component is arranged within the core. In particular, it is possible that none of the first component and the second component protrudes upwardly and/or downwardly beyond the core. A vertical height of the core may be larger than a vertical height of the first component and/or may be larger than a vertical height of the second component. Advantageously, the vertical extension of the embedded components may be completely or at least substantially completely limited by the vertical extension of the common single core accommodating both the first component and the second component. Thereby, a compact configuration in a vertical direction may be achieved. Even more important, warpage may be further suppressed due to the symmetrical arrangement of the components, both within a horizontal plane and in a vertical direction.

In an embodiment, a first material of the first adhesive structure and a second material of the second adhesive structure are different. When the materials of the first and second adhesive structures are different, they can be adjusted individually in accordance with their corresponding tasks within the component carrier. By taking this measure, the flexibility of a component carrier designer can be further increased.

In an embodiment, the different first and second materials are select-ed to obtain different functionalization, in particular different functionalization concerning at least one of the group consisting of thermal conductivity, coefficient of thermal expansion, high-frequency capability, magnetic properties and electromagnetic shielding capability. Highly advantageously, the different first and second materials may provide a different functionalization within the component carrier. For instance, one of said materials may be provided with a high thermal conductivity (for instance above 2 W/mK or even above 5 W/mK) so as to promote heat removal from an interior of the component carrier. It is also possible that the coefficient of thermal expansion (CTE) of a respective one of the materials is adjusted for instance to reduce a CTE mismatch between the respective adhesive structure and its environment within the component carrier. According to yet another embodiment, a high frequency capability of one of said materials may be adjusted, for instance to comply with radiofrequency (RF) requirements of an embedded RF component. For instance, such a high frequency capable material may show a low loss in an RF domain. A material of a respective one of the adhesive structures having an electromagnetic shielding capability may shield electromagnetic radiation from propagating for instance between one of the embedded components and an environment of the component carrier. EMI (electromagnetic interference) issues may thereby be reliably prevented. In terms of magnetic properties, it is for instance possible that at least one of said materials has paramagnetic or permanent magnetic (for instance ferromagnetic) properties, for instance achievable by adding magnetic filler particles.

In another embodiment, a first material of the first adhesive structure and a second material of the second adhesive structure are the same. As an alternative to the previously described embodiments, it is also possible to configure the first and the second materials of the first and the second adhesive structures from the same material, for instance based on epoxy resin. By taking this measure, the homogeneity of the material within an interior of the component carrier may be reduced.

In an embodiment, a thickness of adhesive material below the first component is larger than a thickness of adhesive material below the second component. This locally increased thickness below the first component as compared to the second component results from the fact that the first component is firstly embedded in the first hole before embedding the second component in the second hole, with the respective adhesive structure being attached to at a bottom side. Descriptively speaking, the bottom of the first component may be covered with contributions from both the first and the second adhesive structures, whereas a bottom of the second component may be covered by the second adhesive structure, but not by the first adhesive structure.

In an embodiment, a thickness of adhesive material above the first component is different from a thickness of adhesive material above the second component. As a consequence of the described manufacturing procedure, the thickness of the adhesive material below the first component may be larger than the thickness below the second component (see previous paragraph). This may result in different vertical levels of the lower main surfaces of the two components being embedded in the stack. Even if both components have the same thickness, this may result in different height levels of the upper main surfaces of the first and second components. Therefore, adhesive material on top of the first and second components may have a different thickness.

In an embodiment, the first adhesive structure is absent at a bottom of the second component. For instance, material of the first adhesive structure may be removed from a portion of the stack when cutting a hole for subsequently embedding the second component.

In an embodiment, the first component and the second component have the same height. This provides for a very homogeneous component carrier with consequently strongly suppressed warpage. In alternative embodiments, the height of the first and second components may be different.

In an embodiment, the bottom of the first component and the bottom of the second component are arranged at different vertical levels. This may be the result of the provision of only the second adhesive structure below the second component, but both the first adhesive structure and the second adhesive structure below the first component.

In an embodiment, a ratio between a volume of all embedded components and a volume of the entire component carrier is at least 0.3, in particular is at least 0.5. When the die-to-package ratio is very high, high warpage may be present due to the low rigidity of the board. This warpage may be strongly suppressed when the presence of multiple holes in the core at the same time is avoided, as in exemplary embodiment of the invention.

In an embodiment, the method comprises embedding the respective component in a respective through hole extending through the stack. In such an embodiment, a respective component accommodation volume may extend through the entire stack. For inserting the respective component in the respective through hole, a bottom of the respective through hole may be temporarily closed by a respective temporary carrier such as an adhesive tape. The respective temporary carrier may provide temporarily mechanical support for the component(s) before the arrangement of stack and component(s) becomes rigid by a lamination or a gluing procedure. After the laminating or gluing, the respective temporary carrier may then be removed, since the arrangement of stack, respective component and laminated dielectric material or glue may now be sufficiently rigid that the support function of the respective temporary carrier is no longer needed. Additionally or alternatively to lamination, it is also possible to at least partially fill the at least one cavity with a filling medium (in particular an adhesive material or glue) before or after placing the respective component in the respective cavity or through hole of the stack. For instance, the filling medium may be filled in the respective cavity by dispensing, an ink-jet procedure, etc.

For instance, such a temporary carrier may be a sticky tape which may be attached to the back side of the stack and which may close a through hole in the stack for delimiting a respective cavity for the component. The component may then be placed on the sticky surface of the temporary carrier so as to ensure a correct positioning of the component. After having attached and connected (in particular by lamination) the electrically insulating layer structure to the stack and the component while simultaneously filling the gaps in between with material of the electrically insulating layer structure to thereby obtain a rigid structure, the temporary carrier is no longer needed and can be removed from the back side. Thus, it is possible that the temporary carrier does not form part of the readily manufactured component carrier. Nevertheless, the temporary carrier may contribute to the spatially accurate positioning of the respective component in the stack.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure and/or thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

A substrate or interposer may comprise or consist of at least a layer of glass, silicon, ceramic and/or organic material (like resin). A substrate or interposer may also comprise a photo-imageable or dry-etchable organic material like epoxy-based Build-Up films or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin, more specifically FR-4 or FR-5), cyanate ester resin, polyphenylene derivate, glass (in particular glass fibers, glass-spheres, multi-layer glass, glass-like materials), prepreg material, photo-imageable dielectric material, polyimide, polyamide, liquid crystal polymer (LCP), epoxy-based Build-Up Film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multilayer glass) may be used as well. Although prepreg (such as FR4), or epoxy-based Build-Up Film or photo-imageable dielectrics are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, each of the first component the second component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier and/or may be surface mounted. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, any of the components may also be a further component carrier (for example a printed circuit board, a substrate, or an interposer) in a board-in-board configuration.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF THE ILLUSTRATED EMBODIMENTS

The illustrations in the drawings are schematically presented. In different drawings, similar or identical elements are provided with the same reference signs.

Before referring to the drawings, exemplary embodiments will be de-scribed in further detail, some basic considerations will be summarized based on which exemplary embodiments of the invention have been developed.

According to an exemplary embodiment of the invention, a component carrier having at least two components embedded in a stack thereof is provided, wherein embedding the second component is not initiated before having completed embedding of the first component. If a third component is (or multiple further components are) embedded in the same component carrier, this may be accomplished after having completed embedding of the first and the second component. By taking this measure, a multiple embed-ding manufacturing architecture is provided with highly advantageous properties in terms of warpage suppression. The conventional risk of warp-age in particular at high die-to-package ratios may be mitigated by dividing the embedding process in two or more separate process stages to thereby prevent the formation of multiple holes in the same stack at the same time.

When the die-to-package ratio is very high (for instance 0.5 or more), high warpage may be present due to the low rigidity of the board. This warpage that appears on panel level may cause the manufacturing process to stop or become unprecise. Dividing embedding procedures in two or more stages may allow to have less deformation during heat procedure impressed, thus obtaining better warpage behavior, performance and capability. As a result of such a separation of different embedding stages, components embedded in the same stack may not be at the same lower level, but may for instance have a difference in height of 0.7 µm to 7 µm. A reason for this is a protection layer applied of adhesive material on already embedded components from a lower side.

A gist of an exemplary embodiment of the invention is to produce a high die-to-package ratio embedded package without giving up wide material selection to target desired performance. An advantage of such an embodiment is also that material restrictions are relaxed, such as less restrictions in terms of Young modulus of involved materials, CTE behavior, etc.

According to an exemplary embodiment of the invention, a component carrier is produced having at least two embedded components being located (in particular substantially completely) within the same core layer of a stack. Thus, it may be possible to use the same build-up layer for interconnection of both (or more than two) embedded components. In particular, a laser process for forming electrically conductive contacts of the embedded com-ponents can be initiated only after completion of the second (or last) embedding. Thus, it may be advantageously dispensable to build-up height to get to a next layer for a subsequent (for instance second) embedding.

Figures 6, 7:
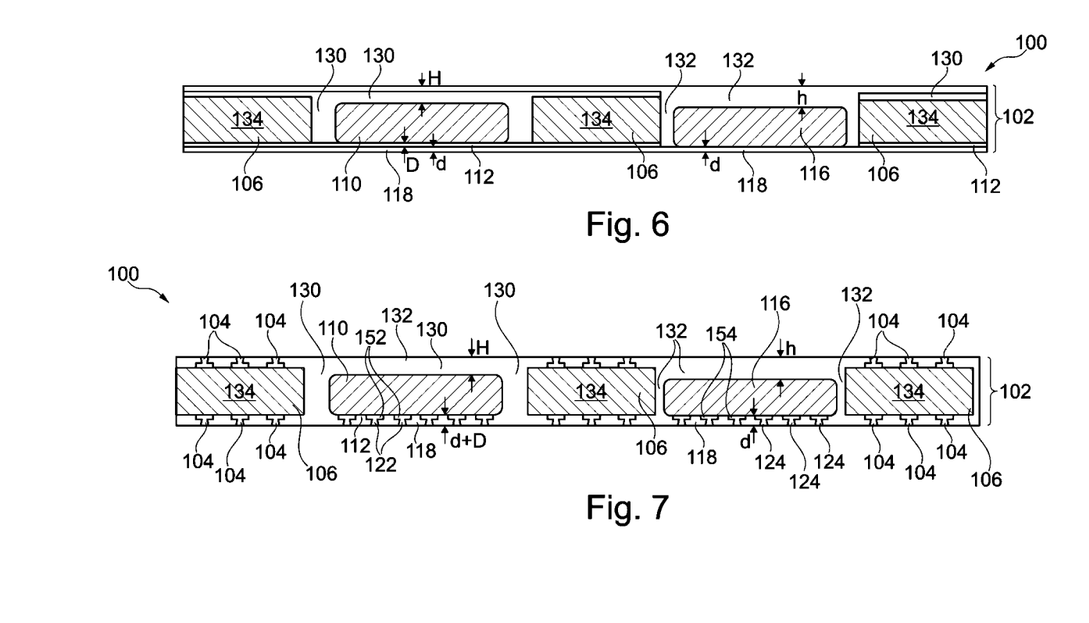
FIG. 7 illustrates a cross-sectional view of a component carrier with embedded components according to an exemplary embodiment of the invention.

FIG. 1 to FIG. 6 illustrate cross-sectional views of structures obtained during carrying out a method of manufacturing a component carrier 100 with embedded components 110, 116 according to an exemplary embodiment of the invention. The obtained plate-shaped laminate-type component carrier 100, which is here configured as printed circuit board (PCB), is shown in FIG. 6.

Figures 1, 2:
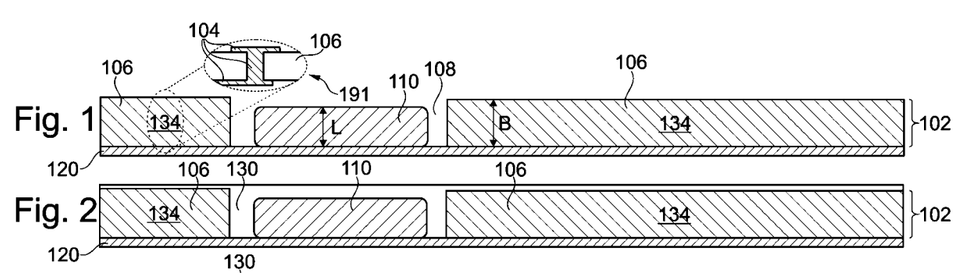
FIG. 1, FIG. 2, FIG. 3, FIG. 4, FIG. 5 and FIG. 6 illustrate cross-sectional views of structures obtained during carrying out a method of manufacturing a component carrier with embedded components, the component carrier being shown in FIG. 6, according to an exemplary embodiment of the invention.

Referring to FIG. 1, a layer stack 102 with a first hole 108 accommodating a first component 110 is shown.

As illustrated schematically in a detail 191, the stack 102 may be a plate shaped laminate type layer stack composed of one or more electrically conductive layer structures 104 and one or more electrically insulating layer structures 106. For example, electrically conductive layer structures 104 may comprise patterned copper foils and vertical through connections, for example copper filled laser vias. Electrically insulating layer structure 106 may comprise a resin (such as epoxy resin) and optionally reinforcing particles therein (for instance glass fibers or glass spheres). For instance, the electrically insulating layer structures 106 may be made of FR4. In the shown embodiment, the stack 102 may be a single fully cured core 134 having a vertical thickness B of for example 100 µm. Thickness L of the first component 110 may be smaller, for instance 80 µm.

During manufacturing component carrier 100, first hole 108 is formed in the stack 102, for instance by laser cutting or mechanically cutting. The first hole 108 is a through hole extending through the entire stack 102. In order to enable accommodation of first component 110 in the first hole 108, it is possible to temporarily close the through hole at a bottom side by a temporary carrier 120, such as a sticky tape, before embedding the first component 110. Subsequently, it is possible to place first component 110 in the first hole 108 and on the sticky surface of the temporary carrier 120.

Thus, FIG. 1 shows the result of the formation of a first cavity in form of through hole 108, tape lamination to attach the temporary carrier 120 to the core 134, and placement of the first component 110 on the sticky tape and in the through hole 108.

Referring to FIG. 2, the first component 110 is glued in place within the first hole 108 by laminating a previously at least partially uncured electrically insulating layer structure, for instance a sheet of prepreg, on top of the structure shown in FIG. 1. At the result, encapsulating adhesive structure 130 is obtained which encapsulates and thereby embeds first component 110 in hole 108 and also covers the upper surface of the core 134. Thus, in order to obtain the structure shown in FIG. 2, the structure shown in FIG. 1 may be made subject to a lamination procedure. More specifically, the at least partially uncured electrically insulating layer structure may be attached from above to the structure shown in FIG. 1 and may be cured by lamination, i.e. the application of heat and/or mechanical pressure. As a result, the previously at least partially uncured material of the attached electrically insulating layer structure becomes flowable, cures and re-solidifies to thereby circumferentially surround the first component 110. In other words, the process described referring to FIG. 2 describes a top side resin pressing procedure for providing a partial top dielectric build-up. The attached electrically insulating layer structure surrounds the first component 110 in the through hole 108 and covers the upper main surface of the core 134.

Figures 3, 4, 5:
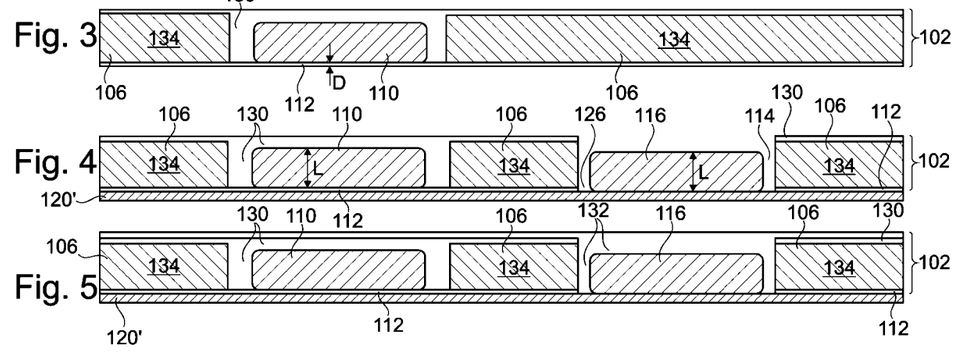

Referring to FIG. 3, the temporary carrier 120 may be removed after having adhered the first component 110 within the stack 102. Further subsequently, it is possible to provide a layer-type first adhesive structure 112 as a protection layer to a bottom of the first component 110 and to a bottom of stack 102.

Hence, in order to obtain the structure shown in FIG. 3, the temporary carrier 120 may firstly be removed, for instance by peeling off the sticky tape. The support function of the temporary carrier 120 is no longer required, since curing of the previously at least partially uncured electrically insulating layer structure, forming encapsulating adhesive structure 130, has made the layer structure sufficiently rigid.

As can be taken from FIG. 3 as well, the layer-type first adhesive structure 112 has then be formed on a bottom main surface of the core 134, the encapsulating adhesive structure 130 and the first component 110. Descriptively speaking, the first adhesive structure 112 forms resin below the first component 110 and below the stack 102. In other words, a bottom side resin pressing procedure is carried out for creating a bottom dielectric build-up. A thickness D of the layer-type first adhesive structure 112 may be for instance in a range between 0.5 µm and 7 µm.

After having obtained the structure shown in FIG. 3 and now referring to FIG. 4, a second hole 114 is formed subsequently in another portion of the stack 102. As shown, the second hole 114 is also a through hole extending through the entire stack 102. For instance, the second hole 114 may be formed by laser drilling or mechanically drilling. In order to enable accommodation of a second component 116 in the second hole 114, it is possible to temporarily close this through hole at a bottom side by a further temporary carrier 120', such as a further sticky tape, after forming the second hole 114 and before embedding the second component 116.

Thereafter, it is possible to accommodate the second component 116 in the second hole 114 and attach it to the further sticky tape.

More specifically, in order to obtain the structure shown in FIG. 4, firstly the second through hole 114 is formed in the stack 102, followed by the attachment of further temporary carrier 120' on the lower main surface of the first adhesive structure 112 and closing the second hole 114 from a bottom side. Thereafter, the second component 116 is placed in the second through hole 114 and is attached to the sticky surface of the further temporary carrier 120'. In other words, the structure shown in FIG. 4 is obtained by a second cavity formation process, a tape lamination, and the placement of the second component 116.

As can be taken from FIG. 4, the first adhesive structure 112 is absent at a bottom of the second component 116, since the portion of the first adhesive structure 112 applied in this region according to FIG. 3 has been removed when cutting the second hole 114. The first adhesive structure 112 embodied as first adhesive layer has a recess 126 in the second hole 114. Still referring to FIG. 4, it can be seen that the bottom of the first component 110 and the bottom of the second component 116 are arranged at different vertical levels. This is the result of the fact that the first adhesive structure 112 is present only beneath the first component 110, but not beneath the second component 116.

It can also be taken from FIG. 4 that the first component 110 and the second component 116 have the same height L. For instance, the height of the respective component 110, 116 may be in the range between 50 μm and 500 μm. Components 110, 116 may alternatively have different heights.

Referring to FIG. 5, the second component 116 is glued in place within the second hole 114 by laminating a further initially at least partially uncured electrically insulating layer structure on top of the structure shown in FIG. 4.

Thus, in order to obtain the structure shown in FIG. 5, the further electrically insulating layer structure of initially at least partially uncured material (for instance a prepreg sheet) is attached and laminated on top of the structure shown in FIG. 4, This can be accomplished in a similar way as described referring to FIG. 2. As a consequence, further encapsulating adhesive structure 132 is produced on the basis of said further at least partially uncured electrically insulating layer structure. The second component 116 is glued in place within the second through hole 114 and is partially encapsulated by the further encapsulating adhesive structure 132. The previously at least partially uncured material which is fully cured during the lamination process circumferentially surrounds the second component 116 to thereby form further encapsulating adhesive structure 132. Again, a top side resin pressing procedure for creating a final top dielectric build-up may be carried out.

Referring to FIG. 6, the further temporary carrier 120' may be removed after having adhered the second component 116 within the stack 102. Further subsequently, it is possible to form a layer-type second adhesive structure 118 at a bottom of the second component 116 and at a bottom of the first adhesive structure 112. Also, an exposed bottom surface of the further encapsulating adhesive structure 132 is covered with material of the second adhesive structure 118.

Hence, in order to obtain the component carrier 100 shown in FIG. 6, the further temporary carrier 120' may be removed from a bottom side of the structure shown in FIG. 5, for instance by peeling off the sticky tape. Furthermore, second adhesive structure 118 shaped as a layer is attached to the lower main surface of the so obtained layer structure.

As a consequence, the thickness d+D of the adhesive dielectric material directly below the first component 110 is larger than the thickness d of the dielectric adhesive below the second component 116. Furthermore, thickness H of dielectric material above the first component 110 is smaller than thickness h of dielectric material above the second component 116.

Highly advantageously and as seen in FIG. 6, both the first component 110 and the second component 116 are embedded within common single core 134 of the stack 102. As shown, substantially an entire vertical extension of each of the first component 110 and of the second component 116 is arranged within the core 134, only the second component 116 extends vertically into the vertical level of the thin film provided by the first adhesive structure 112. As can be taken from FIG. 6 as well, none of the first component 110 and the second component 116 protrudes upwardly beyond the core 134. As shown in FIG. 1, height B of the core 134 is larger than a height L of the first component 110. In the illustrated embodiment, the height L of the first component 110 is identical to the height L of the second component 116. This configuration provides for a vertically compact component carrier 100 and strongly suppresses warpage due to the homogeneous material distribution within the component carrier 100, both in a horizontal plane and in the vertical direction.

Altogether, four adhesive structures are shown in the component carrier 100 according to FIG. 6: First adhesive structure 112 and second adhesive structure 118 are layer-shaped, whereas encapsulating adhesive structure 130 forms a third adhesive structure and further encapsulating adhesive structure 132 forms a fourth adhesive structure. The individual materials of the various adhesive structures may be the same or may be different. For instance, different ones of the adhesive structures may be functionalized in a different way, for instance in terms of thermal conductivity, CTE behavior, high-frequency behavior, etc.

FIG. 7 illustrates a cross-sectional view of a component carrier 100 with embedded components 110, 116 according to an exemplary embodiment of the invention.

Based on a structure similar to that shown in FIG. 6, component carrier 100 illustrated in FIG. 7 may be obtained by forming first electrically conductive contacts 122 to contact pads 152 on a bottom of the first component 110. Furthermore, second electrically conductive contacts 124 may be formed to contact pads 154 on a bottom of the second component 116. For example, both the first electrically conductive contacts 122 and the second electrically conductive contacts 124 may be formed simultaneously and after embedding the second component 116 in the second hole 114.

As a result, the component carrier 100 illustrated in FIG. 7 is obtained which comprises stack 102 composed of electrically conductive layer structures 104 and electrically insulating layer structures 106. In particular, the stack 102 comprises a single central core 134 in which both the first component 110 and the second component 116 are embedded and in which the first hole 108 and the second hole 114 are formed. First component 110 is embedded in first hole 108 of the stack 102. First adhesive structure 112 is provided at a bottom of the first component 110. Second component 116 is embedded in second hole 114 of the stack 102. Each of the first hole 108 and the second hole 114 is a through hole extending through the entire stack 102. Second adhesive structure 118 is formed at a bottom of the second component 116 and at a bottom of the first adhesive structure 112. In the shown embodiment, the first adhesive structure 112 is a first adhesive layer.

Furthermore, the illustrated component carrier 100 comprise third adhesive structure 130 encapsulating the first component 110 in the first hole 108. Fourth adhesive structure 132 encapsulates the second component 116 in the second hole 114.

Thus, FIG. 7 shows component carrier 100 according to an exemplary embodiment of the invention with first and second components 110, 116 embedded according to a procedure described referring to FIG. 1 to FIG. 6, i.e. without being prone to warpage. After embedding, the pads 152, 154 of the first and second components 110, 116 may be exposed by laser drilling. Laser drill holes may then be filled by electrically conductive material such as copper to thereby form electrically conductive contacts 122, 124. This can be accomplished by electroless plating, galvanic plating, etc. As a result, the components 110, 116 (here both face down components) may be electrically connected to an electronic periphery of the component carrier 100. Additionally or alternatively, pads on the upper main surfaces of one or both of the components 110, 116 may be electrically contacted by drilling holes through the adhesive material above the embedded components 110, 116 (not shown).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of manufacturing component carriers, comprising:
   providing a stack comprising at least one electrically conductive layer structure and/or at least one electrically insulating layer structure;
   forming a first hole in a core layer of the stack, and subsequently embedding a first component on a first adhesive structure in the first hole;
   thereafter forming a second hole in the same core layer of the stack, and subsequently embedding a second component in a recess in the first adhesive structure in the second hole.

2. The method according to claim 1,
   wherein embedding comprises encapsulating the first component and covering the core layer before forming the second hole.

3. The method according to claim 1, further comprising:
   forming a second adhesive structure at a bottom of the second component and at a bottom of the first adhesive structure after embedding the second component.

4. The method according to claim 1, wherein each of the first hole and the second hole is a through hole extending through the entire stack, and wherein the method comprises temporarily closing a respective one of the through holes at a bottom by a respective temporary carrier before embedding the first component and the second component, respectively.

5. The method according to claim 4, wherein the method comprises removing the respective temporary carrier after having embedded the first component and the second component, respectively, within the stack.

6. The method according to claim 1, further comprising:
   forming a first electrically conductive contact to contact the embedded first component after embedding the second component in the second hole.

7. The method according to claim 1, further comprising:
   forming a second electrically conductive contact to contact the embedded second component simultaneously with the formation of the first electrically conductive contact.

8. A component carrier, comprising:
   a stack comprising at least one electrically conductive layer structure and/or at least one electrically insulating layer structure;
   a first component embedded in a first hole in a core layer of the stack;
   a first adhesive structure at a bottom of the first component;
   a second component embedded in a second hole in the core layer of the stack; and
   a second adhesive structure in contact with the second component and adjacent to the first adhesive structure, wherein the first component is embedded before a second hole is present in the core layer of the stack.

9. The component carrier according to claim 8, wherein the first adhesive structure is a first adhesive layer having a recess in the second hole, wherein the first adhesive layer covers a bottom of the core layer but for the recess in the second hole and/or a thickness of the first adhesive layer structure is in a range between 0.5 µm and 7 µm.

10. The component carrier according to claim 8, wherein the second adhesive structure is a second adhesive layer, wherein a thickness of the second adhesive layer is in a range between 0.6 µm and 7 µm.

11. The component carrier according to claim 8, further comprising:
    a third adhesive structure encapsulating at least part of the first component in the first hole.

12. The component carrier according to claim 11, further comprising:
    a fourth adhesive structure encapsulating at least part of the second component in the second hole.

13. The component carrier according to claim 8, wherein at least one of the first hole and the second hole is a through hole extending through the entire stack.

14. The component carrier according to claim 12, wherein the fourth adhesive structure contacts at least opposed sides of the second component.

15. The component carrier according to claim 8, wherein an entire vertical extension of the first component is arranged within the core layer.

16. The component carrier according to claim 8, wherein none of the first component and the second component protrudes upwardly beyond the core layer.

17. The component carrier according to claim 8, wherein a height of the core layer is larger than a height of the first component and wherein a thickness of the first adhesive structure in combination with a height of the core layer_is larger than a height of the second component.

18. The component carrier according to claim 8, wherein a first material of the first adhesive structure and a second material of the second adhesive structure are different, wherein the different first and second materials provide a different functionalization concerning at least one of the group consisting of thermal conductivity, coefficient of thermal expansion, high-frequency capability, magnetic properties, and electromagnetic shielding capability.

19. The component carrier according to claim 8, wherein a first material of the first adhesive structure and a second material of the second adhesive structure are the same.

20. The component carrier according to claim 8, comprising at least one of the following features:
- wherein a thickness of adhesive material below the first component is larger than a thickness of adhesive material below the second component;
- wherein a thickness of adhesive material above the first component is different from a thickness of adhesive material above the second component;
- wherein the first adhesive structure is absent at a bottom of the second component;
- wherein the first component and the second component have the same height;
- wherein the bottom of the first component and the bottom of the second component are arranged at different vertical levels;
- wherein a ratio between a volume of all embedded components and a volume of the entire component carrier is at least 0.3;
- wherein at least one of the first component and the second component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electro-mechanical transducer, an actuator, a microelectromechanical system, a microprocessor, a capacitor, a resistor, an inductance, an accumulator, a switch, a camera, an antenna, a magnetic element, a further component carrier and a logic chip;
- wherein the at least one electrically conductive layer structure comprises at least one of the group consisting of copper, aluminum, nickel, silver, gold, palladium, and tungsten;
- wherein the at least one electrically insulating layer structure comprises at least one of the group consisting of reinforced or non-reinforced resin, epoxy resin or bismaleimide-triazine resin, FR-4, FR-5, cyanate ester resin, polyphenylene derivate, glass, prepreg material, polyimide, polyamide, liquid crystal polymer, epoxy-based Build-Up Film, polytetrafluoroethylene, a ceramic, and a metal oxide;
- wherein the component carrier is shaped as a plate;
- wherein the component carrier is configured as one of the group consisting of a printed circuit board, and a substrate;
- wherein the component carrier is configured as a laminate-type component carrier.

* * * * *